(12) United States Patent
Yamanaka et al.

(10) Patent No.: US 10,591,079 B2
(45) Date of Patent: Mar. 17, 2020

(54) ELECTRIC ACTUATOR AND MANUFACTURING METHOD FOR SAME

(71) Applicant: DENSO CORPORATION, Kariya, Aichi-pref. (JP)

(72) Inventors: Tetsuji Yamanaka, Kariya (JP); Naoaki Kouno, Kariya (JP); Hiroki Shimada, Kariya (JP); Etsugo Yanagida, Kariya (JP)

(73) Assignee: DENSO CORPORATION, Kariya (JP)

( * ) Notice: Subject to any disclaimer, the term of this patent is extended or adjusted under 35 U.S.C. 154(b) by 280 days.

(21) Appl. No.: 15/736,477

(22) PCT Filed: Jun. 7, 2016

(86) PCT No.: PCT/JP2016/002745
§ 371 (c)(1),
(2) Date: Dec. 14, 2017

(87) PCT Pub. No.: WO2016/203733
PCT Pub. Date: Dec. 22, 2016

(65) Prior Publication Data
US 2018/0187791 A1    Jul. 5, 2018

(30) Foreign Application Priority Data
Jun. 18, 2015    (JP) .................................. 2015-122960

(51) Int. Cl.
*H02K 7/06* (2006.01)
*F16K 31/04* (2006.01)
(Continued)

(52) U.S. Cl.
CPC .......... *F16K 31/047* (2013.01); *F02B 37/186* (2013.01); *F16H 19/001* (2013.01);
(Continued)

(58) Field of Classification Search
CPC ........ H02K 5/22; H02K 7/116; H02K 11/215; H02K 7/14; H02K 7/088
(Continued)

(56) References Cited

U.S. PATENT DOCUMENTS 6,435,169 B1    8/2002    Vogt
2008/0289442 A1    11/2008    Kawada et al.
(Continued)

FOREIGN PATENT DOCUMENTS

JP    2002-349641    12/2002
JP    2004-153914    5/2004
(Continued)

OTHER PUBLICATIONS

International Search Report for PCT/JP2016/002745, dated Jul. 19, 2016, 3 pages.

*Primary Examiner* — Thanh Lam
(74) *Attorney, Agent, or Firm* — Nixon & Vanderhye P.C.

(57) ABSTRACT

A housing includes an opening portion, which opens in one direction. At the time of assembling, the opening portion of the housing is placed to face an upper side. Then, a wave washer, an electric motor and screws for motor fixation are assembled from the upper side, and a first intermediate shaft and a second intermediate shaft are press-fitted, and a lower bearing, an output shaft, a second intermediate gear, a first intermediate gear are assembled. Thereafter, a cover is installed from the upper side to the housing. Next, an actuator lever is connected to a distal end part of the output shaft. As discussed above, the electric actuator can be assembled without inverting an orientation of the housing, and thereby productivity can be improved.

24 Claims, 9 Drawing Sheets

(51) Int. Cl.
*H02K 7/116* (2006.01)
*H02K 11/215* (2016.01)
*F02B 37/18* (2006.01)
*F16H 19/00* (2006.01)
*F16H 21/44* (2006.01)
*F16H 57/031* (2012.01)
*H02K 5/173* (2006.01)
*H02K 5/22* (2006.01)
*H02K 5/24* (2006.01)
*H02K 15/14* (2006.01)
*F16H 57/02* (2012.01)
*G01R 33/02* (2006.01)

(52) U.S. Cl.
CPC ........... *F16H 21/44* (2013.01); *F16H 57/031* (2013.01); *H02K 5/173* (2013.01); *H02K 5/225* (2013.01); *H02K 5/24* (2013.01); *H02K 7/116* (2013.01); *H02K 11/215* (2016.01); *H02K 15/14* (2013.01); *F16H 2057/02034* (2013.01); *G01R 33/02* (2013.01); *H02K 7/06* (2013.01); *H02K 2213/03* (2013.01); *Y02T 10/144* (2013.01)

(58) Field of Classification Search
USPC .......................................... 310/43, 83, 89–90
See application file for complete search history.

(56) References Cited

U.S. PATENT DOCUMENTS

| | | | |
|---|---|---|---|
| 2012/0124993 | A1 | 5/2012 | Kim |
| 2012/0145134 | A1* | 6/2012 | Miyazaki ............. F02D 9/1065 123/568.2 |
| 2013/0049502 | A1 | 2/2013 | Gotoh |
| 2013/0106219 | A1* | 5/2013 | Schneider ................ H02K 5/16 310/89 |
| 2013/0140477 | A1* | 6/2013 | Shimane ................ H02K 7/116 251/129.01 |
| 2018/0172120 | A1* | 6/2018 | Kouno ................... H02K 7/116 |
| 2018/0259088 | A1 | 9/2018 | Yamanaka et al. |

FOREIGN PATENT DOCUMENTS

| | | |
|---|---|---|
| JP | 2012-013023 | 1/2012 |
| JP | 2014-126457 | 7/2014 |
| WO | WO 2016/203734 | 12/2016 |
| WO | WO 2016/203735 | 12/2016 |
| WO | WO 2016/203736 | 12/2016 |

\* cited by examiner (a)

(b)

(c)

ELECTRIC ACTUATOR AND MANUFACTURING METHOD FOR SAME

CROSS REFERENCE TO RELATED APPLICATION

This application is the U.S. national phase of International Application No. PCT/JP2016/002745 filed Jun. 7, 2016, which designated the U.S. and claims priority to Japanese Patent Application No. 2015-122960 filed on Jun. 18, 2015, the entire contents of each of which are hereby incorporated by reference.

TECHNICAL FIELD

The present disclosure relates to an electric actuator for a turbocharger and a manufacturing method for the same.

BACKGROUND ART

A technology recited in the patent literature 1 is known as one example of an electric actuator of a turbocharger.

The patent literature 1 discloses the electric actuator, in which an electric motor, a speed reducing gear device, a lever, a lower cover and an upper cover are assembled to a housing that is designed to receive these components.

In the case of the electric actuator disclosed in the patent literature 1, an assembling direction of the components to be assembled to the housing is not constant. Specifically, in the electric actuator disclosed in the patent literature 1, there are many components that are assembled to the housing upon inverting the orientation of the housing.

Therefore, it is required to invert the orientation of the housing once or multiple times in the middle of assembling the electric actuator.

CITATION LIST

Patent Literature

PATENT LITERATURE 1: JP2002-349641A

SUMMARY OF INVENTION

The present disclosure is made in view of the above point, and it is an objective of the present disclosure to provide an electric actuator of a turbocharger, which is configured to ease assembling of the electric actuator, and a manufacturing method of such an electric actuator.

In order to achieve the above objective, according to the present disclosure, there is provided a manufacturing method of an electric actuator that includes a housing, an electric motor, a speed reducing gear device of a parallel shaft type, an output shaft, a cover and an actuator lever. The housing has an opening portion, which opens in one direction. The electric motor is installed in the housing. The speed reducing gear device is installed in the housing and reduces a rotational speed of a rotational force generated by the electric motor. The output shaft is installed in the housing and is driven by the rotational force, the rotational speed of which is reduced by the speed reducing gear device. The cover is installed to the housing. The cover forms a space between the cover and the housing to receive the electric motor and the speed reducing gear device in the space, and a distal end part of the output shaft is exposed from the cover to an outside of the cover. The actuator lever is fixed to the distal end part of the output shaft, which is exposed to the outside of the cover. The actuator lever drives a valve installed at a turbocharger. The manufacturing method of the electric actuator includes an inside assembling step of assembling the electric motor, the speed reducing gear device and the output shaft into an inside of the opening portion from an upper side, while a side in an opening direction of the opening is defined as the upper side; a cover assembling step of assembling the cover to the housing from the upper side after the inside assembling step; and a lever assembling step of fixing the actuator lever to the distal end part of the output shaft from the upper side after the cover assembling step. By using the manufacturing method of the electric actuator of the present disclosure, the assembling of the electric actuator of the turbocharger can be performed without inverting the orientation of the housing. Therefore, the assembling of the electric actuator can be eased.

Furthermore, the present disclosure provides the electric actuator, which is manufactured with the above-described manufacturing method of the electric actuator. The electric actuator of the present disclosure enables assembling (unidirectional assembling) of the components in a single direction relative to the housing. Therefore, it is possible to provide the electric actuator of the turbocharger, which is configured to ease the assembling of the electric actuator.

Furthermore, according to the present disclosure, there is provided an electric actuator that includes a housing, an electric motor, a speed reducing gear device of a parallel shaft type, an output shaft, a cover and an actuator lever. The housing has an opening portion, which opens in one direction. The electric motor is installed in the housing. The speed reducing gear device is installed in the housing and reduces a rotational speed of a rotational force generated by the electric motor. The output shaft is installed in the housing and is driven by the rotational force, the rotational speed of which is reduced by the speed reducing gear device. The cover is installed to the housing. The cover forms a space between the cover and the housing to receive the electric motor and the speed reducing gear device in the space, and a distal end part of the output shaft is exposed from the cover to an outside of the cover. The actuator lever is fixed to the distal end part of the output shaft, which is exposed to the outside of the cover. The actuator lever drives a valve installed at the turbocharger. The electric motor, the speed reducing gear device and the output shaft are installed in the housing in an axial direction of the output shaft through the opening portion of the housing. The cover closes the opening portion of the housing, in which the electric motor, the speed reducing gear device and the output shaft are installed.

DESCRIPTION OF EMBODIMENTS

Figure 1:
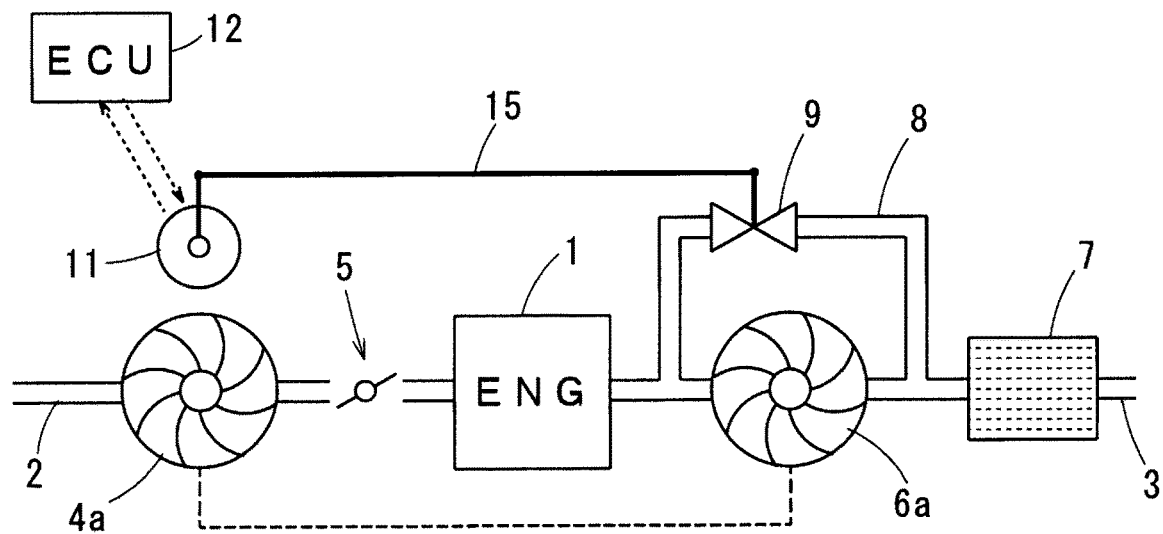
FIG. 1 is a schematic diagram of an engine intake and exhaust system according to an embodiment of the present disclosure.
Figure 2:
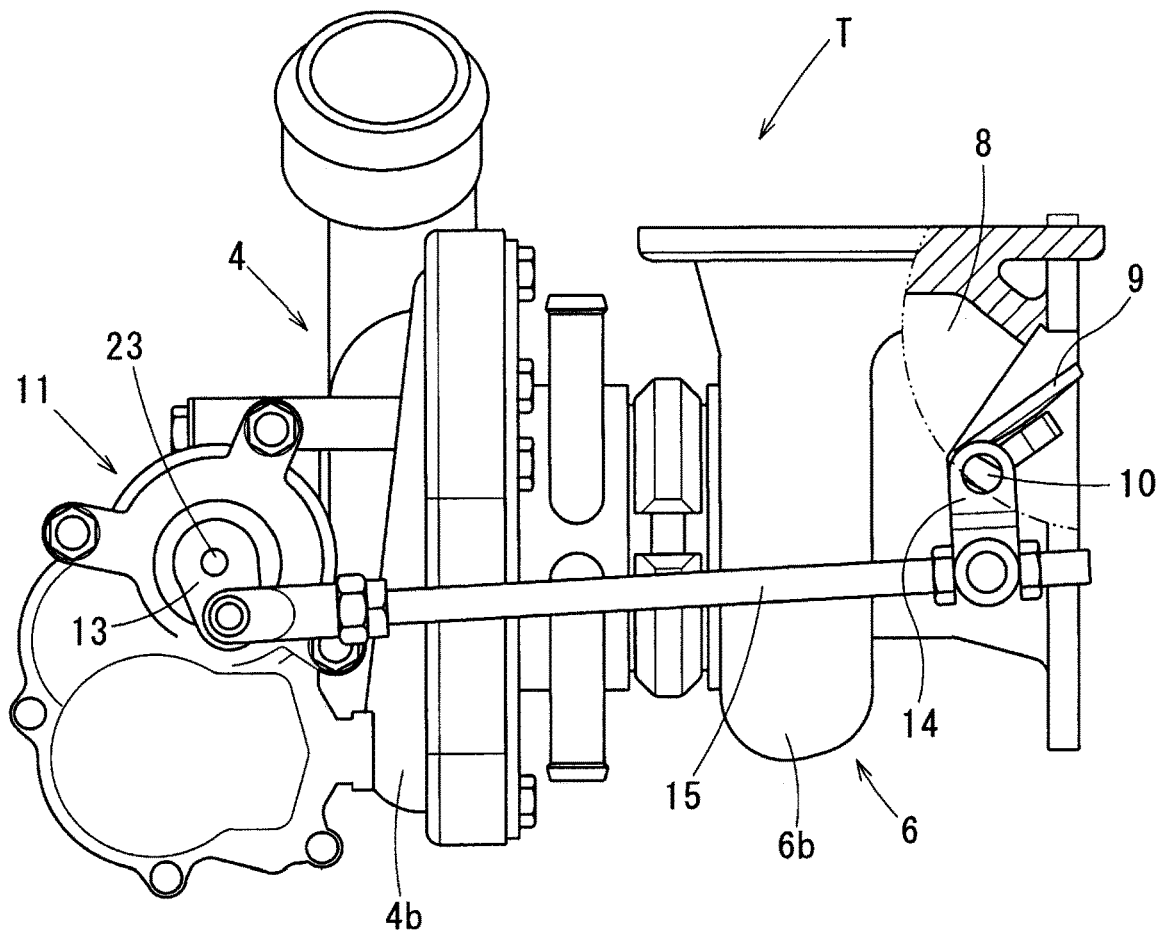
FIG. 2 is a descriptive view of a turbocharger according to the embodiment of the present disclosure.
Figure 3:
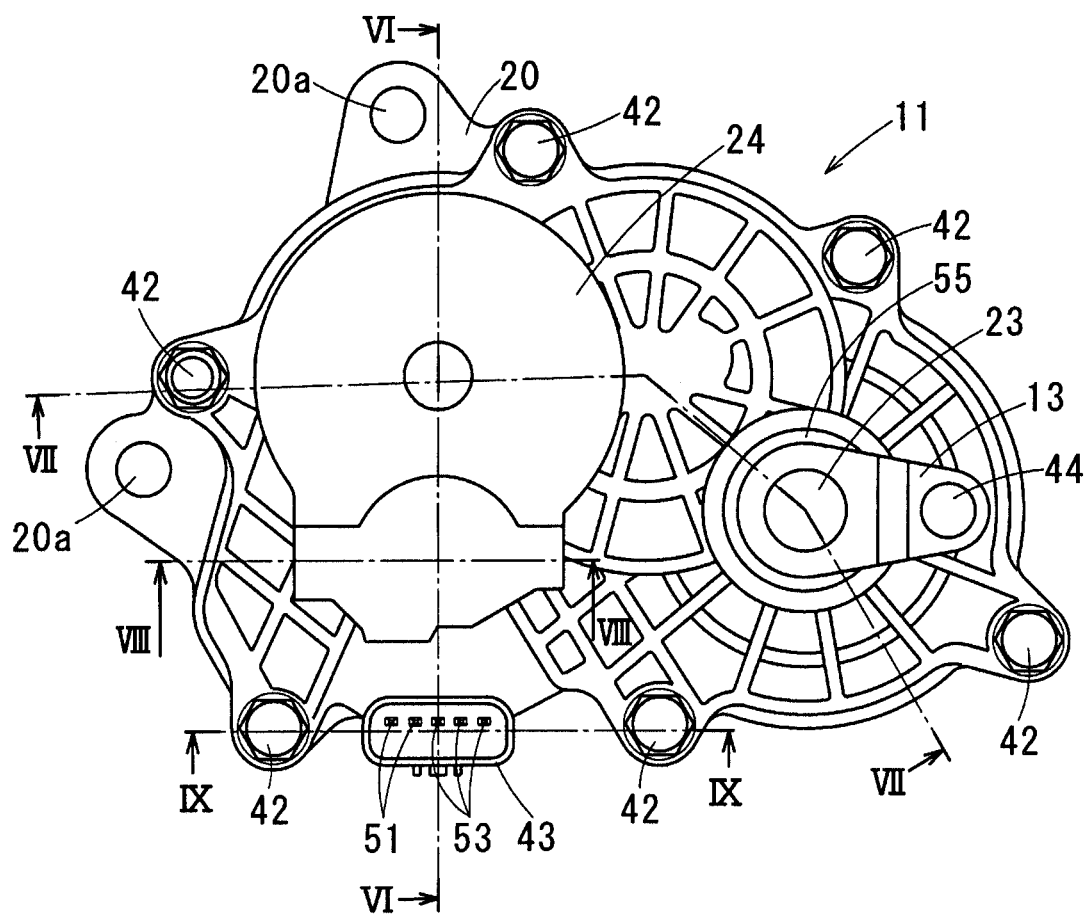
FIG. 3 is a top view of an electric actuator according to the embodiment of the present disclosure.
Figure 4:
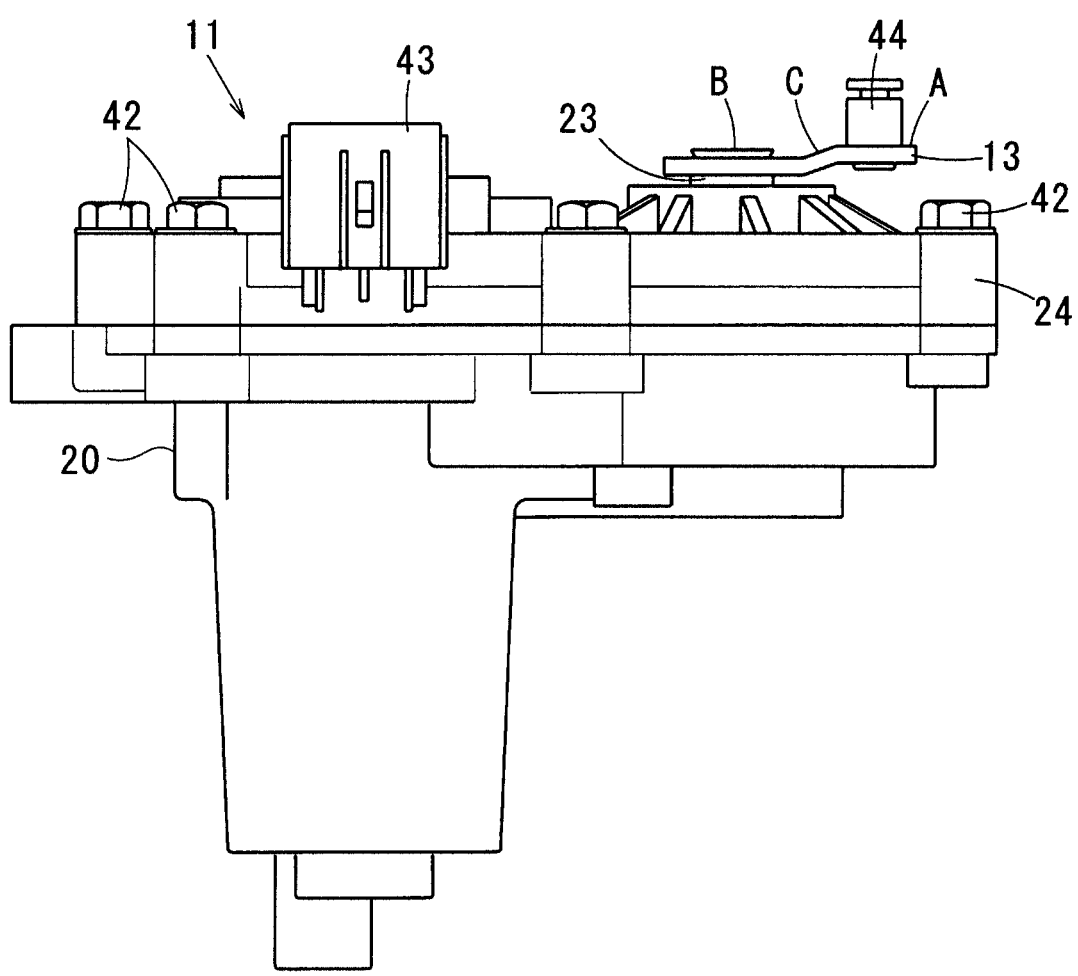
FIG. 4 is a side view of the electric actuator according to the embodiment of the present disclosure.
Figure 5:
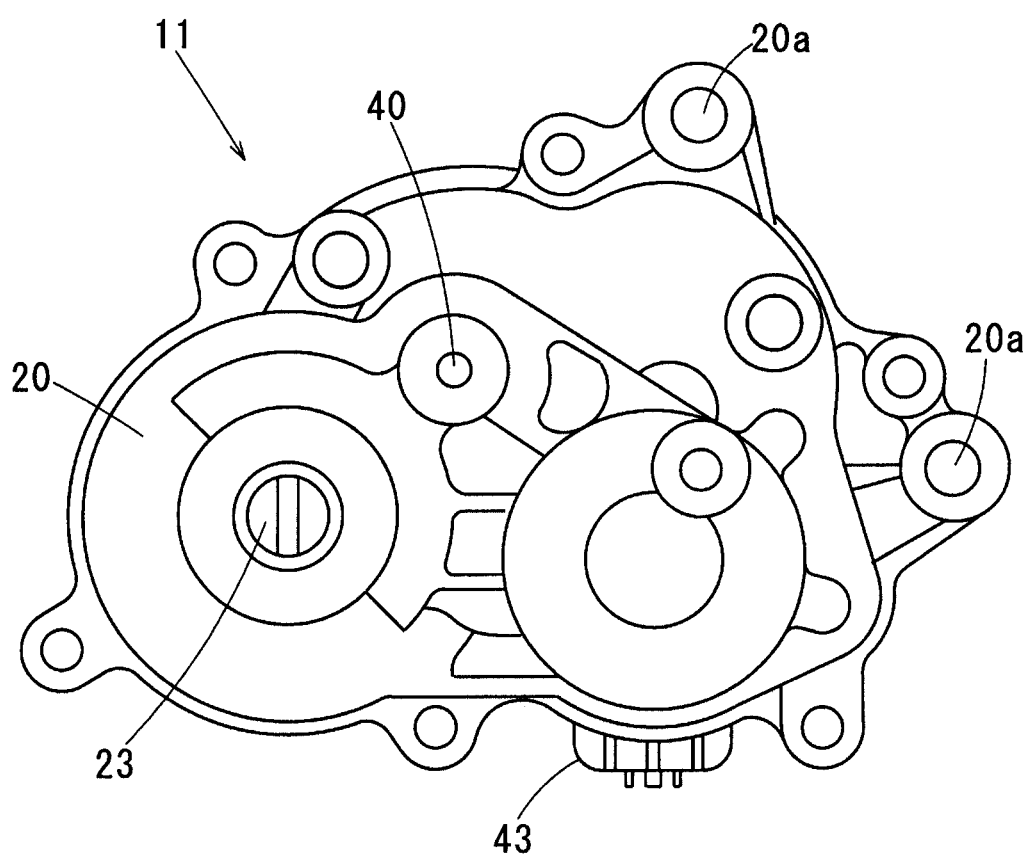
FIG. 5 is a bottom view of the electric actuator according to the embodiment of the present disclosure.
Figure 6:
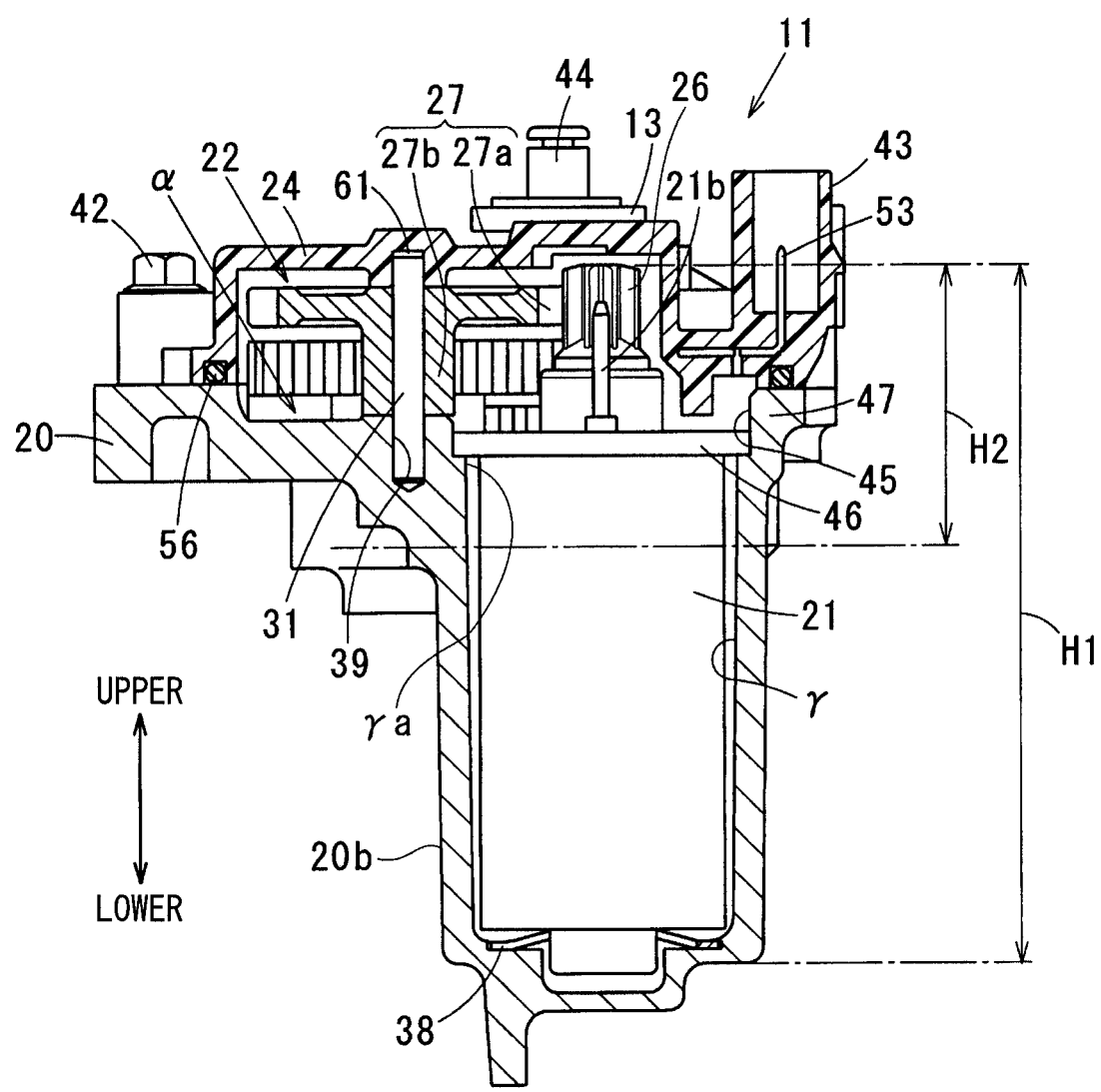
FIG. 6 is a cross-sectional view taken along line VI-VI in FIG. 3.
Figure 7:
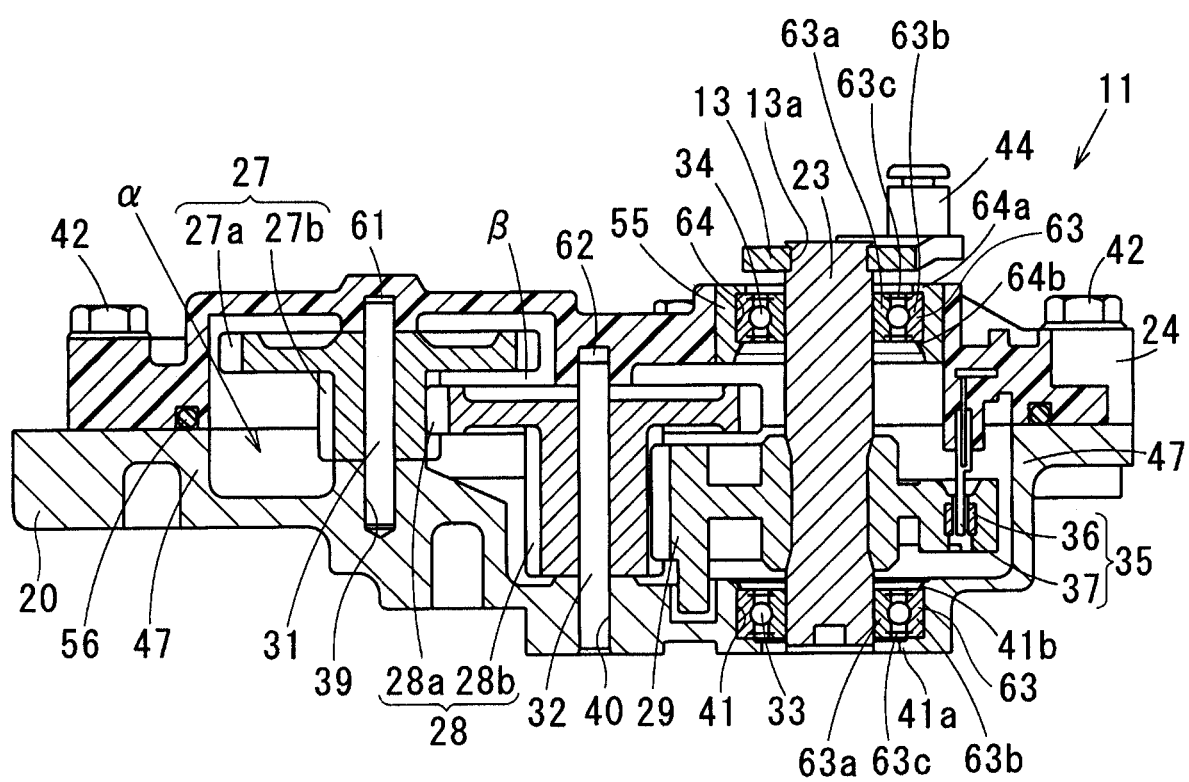
FIG. 7 is a cross-sectional view taken along line VII-VII in FIG. 3.
Figure 8:
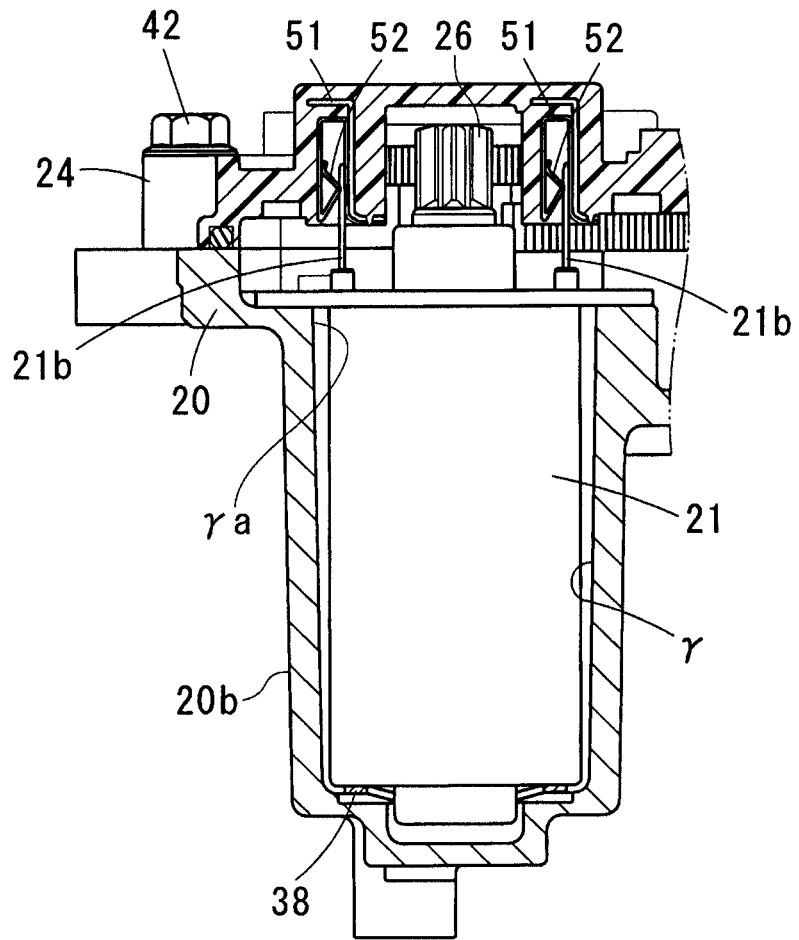
FIG. 8 is a cross-sectional view taken along line VIII-VIII in FIG. 3.

Hereinafter, an embodiment will be described with reference to the drawings. The following embodiment merely discloses an example, and it should be understood that the present disclosure is not necessarily limited to the following embodiment.

First Embodiment

A first embodiment will be described with reference to FIGS. 1 to 10(c).

An engine 1, which is installed at a vehicle and drives the vehicle, has an intake passage 2, which guides intake air to cylinders of the engine 1, and an exhaust passage 3, which discharges exhaust gas generated in the cylinders to the atmosphere.

An intake air compressor 4 of a turbocharger T and a throttle valve 5 for adjusting the amount of intake air supplied to the engine 1 are installed to the middle of the intake passage 2.

An exhaust gas turbine 6 of the turbocharger T and a catalyst 7 for purifying the exhaust gas are installed to the middle of the exhaust passage 3. The catalyst 7 is a known three-way catalyst having a monolithic structure. The catalyst 7 purifies noxious components contained in the exhaust gas through a chemical oxidation and reduction process upon increasing of the temperature of the catalyst 7 to an activation temperature.

The exhaust gas turbine 6 includes: a turbine wheel 6a, which is rotated by the exhaust gas discharged from the engine 1; and a turbine housing 6b, which is shaped into a vortex form and receives the turbine wheel 6a.

The intake air compressor 4 includes: a compressor wheel 4a, which is rotated upon receiving a rotational force from the turbine wheel 6a; and a compressor housing 4b, which is shaped into a vortex form and receives the compressor wheel 4a.

A bypass passage 8, which conducts the exhaust gas while bypassing the turbine housing 6b, is formed at the turbine housing 6b.

The bypass passage 8 directly guides the exhaust gas, which flows into the turbine housing 6b, to an exhaust gas outlet of the turbine housing 6b. This bypass passage 8 is configured to be openable and closable by a wastegate valve 9.

The wastegate valve 9 is a swing valve that is rotatably supported in an inside of the turbine housing 6b. Specifically, the wastegate valve 9 is rotated through a valve shaft 10 that is supported such that the valve shaft 10 is rotatable relative to the turbine housing 6b.

The wastegate valve 9 adjusts an opening degree of the bypass passage 8 to control a boost pressure generated by the turbocharger T at the time of operating the engine 1 at, for example, a high rotational speed.

Furthermore, the wastegate valve 9 fully opens the bypass passage 8 to warm up the catalyst 7 when the temperature of the catalyst 7 has not yet reached the activation temperature at the time of, for example, immediately after cold start of the engine 1. In this way, the high temperature exhaust gas, from which the heat is not taken by the turbine wheel 6a, can be guided to the catalyst 7, so that the rapid warm-up of the catalyst 7 can be executed.

The turbocharger T includes an electric actuator 11 as a means for rotating the wastegate valve 9. An ECU 12, which executes an engine control operation, controls energization of the electric actuator 11.

The electric actuator 11 is installed to the intake air compressor 4, which is remote from the exhaust gas turbine 6, for the purpose of avoiding an influence of the heat of the exhaust gas. As discussed above, the electric actuator 11 is installed at the location that is remote from the wastegate valve 9. Therefore, the turbocharger T has a link mechanism that conducts an output of the electric actuator 11 to the wastegate valve 9.

The link mechanism is a so-called four-bar linkage and includes: an actuator lever 13 that is rotated by the electric actuator 11; a valve lever 14 that is coupled to the valve shaft 10; and a rod 15 that conducts a rotational torque, which is applied to the actuator lever 13, to the valve lever 14.

Now, the electric actuator 11 will be described.

The electric actuator 11 includes: a housing 20 that is installed to the intake air compressor 4; an electric motor 21 that is installed in the housing 20; a speed reducing gear device 22; an output shaft 23; a cover 24; and the actuator lever 13 that is fixed to a distal end part of the output shaft 23.

The housing 20 has an opening portion α that opens toward one side.

Hereinafter, for the descriptive purpose, a direction, in which the opening portion α opens, will be referred to as "upper", and an opposite direction will be referred to as "lower". This upper-to-lower direction should not limit an installation direction. Here, reference sign 20a shown in FIG. 3 indicates bolt insertion holes that are used at the time of assembling the electric actuator 11 to the intake air compressor 4.

The housing 20 is a die-cast product made of, for example, aluminum and is a one-piece body that is seamlessly and integrally formed in one piece. The cover 24 is installed to an upper portion of the housing 20 and closes the opening portion α of the housing 20.

The electric motor 21 and the speed reducing gear device 22 are placed in a space β that is formed between the housing 20 and the cover 24.

The electric motor 21 is installed in the housing 20. Specifically, the electric motor 21 is inserted into a motor insertion chamber γ, which is formed in an inside of a motor insertion portion 20b of the housing 20, and thereafter the electric motor 21 is fixed to the housing 20 with, for example, screws. An outer surface of the housing 20, which includes the motor insertion portion 20b, is directly exposed to the surrounding atmosphere, so that the heat, which is generated from the electric motor 21, can be effectively released to the atmosphere. The electric motor 21 is not necessarily limited to any particular one and may be, for example, a known direct current electric motor or a known stepping motor.

The speed reducing gear device 22 is installed into the housing 20. This speed reducing gear device 22 is a parallel shaft type that reduces a rotational speed of a rotational force generated by the electric motor 21.

Specifically, the speed reducing gear device 22 includes: a pinion gear 26 that is driven by the electric motor 21; a first intermediate gear 27 that is rotated by the pinion gear 26; a second intermediate gear 28 that is rotated by the first intermediate gear 27; and a final gear 29 that is rotated by the second intermediate gear 28. An axis of the pinion gear 26, an axis of the first intermediate gear 27, an axis of the second intermediate gear 28 and an axis of the final gear 29 are parallel to each other.

The pinion gear 26 is an external gear that has a small diameter and is fixed to the rotatable shaft of the electric motor 21.

The first intermediate gear 27 is a double gear that includes a first large diameter gear 27a and a first small diameter gear 27b, which are coaxial. The first intermediate gear 27 is rotatably supported by a first intermediate shaft 31 that is fixed to the housing 20. The first large diameter gear 27a is always meshed with the pinion gear 26.

Similar to the first intermediate gear 27, the second intermediate gear 28 is a double gear that includes a second large diameter gear 28a and a second small diameter gear 28b, which are coaxial. The second intermediate gear 28 is rotatably supported by a second intermediate shaft 32 that is fixed to the housing 20. The second large diameter gear 28a is always meshed with the first small diameter gear 27b, and the second small diameter gear 28b is always meshed with the final gear 29.

The final gear 29 is an external gear that has a large diameter and is fixed to the output shaft 23. The final gear 29 is formed only in a predetermined rotational range.

The output shaft 23 is rotatably supported by a lower bearing 33, which is installed to the housing 20, and an upper bearing 34, which is installed to the cover 24.

The electric actuator 11 includes a rotational angle sensor 35. The rotational angle sensor 35 senses a drive angle of the output lever 13 by sensing a rotational angle of the output shaft 23, and thereby the rotational angle sensor 35 senses an opening degree of the wastegate valve 9.

The rotational angle sensor 35 is a contactless type and includes: a magnetic flux generating portion 36, which is rotated integrally with the output shaft 23; and a magnetic sensing device 37, which is installed to one of the cover 24 and the housing 20 and senses a magnetic flux generated from the magnetic flux generating portion 36. The rotational angle of the output shaft 23, which is sensed by the rotational angle sensor 35, is outputted to the ECU 12. Details of the rotational angle sensor 35 will be described later.

The ECU 12 is an engine control unit having a microcomputer and includes a control program for controlling energization of the electric actuator 11.

Specifically, the ECU 12 computes a target opening degree of the wastegate valve 9 that is suitable for an operational state of the engine 1 based on the operational state of the engine 1. Then, the ECU 12 executes a feedback control operation of the electric actuator 11 such that the sensed opening degree, which is sensed through the rotational angle sensor 35, coincides with the computed target opening degree. This boost pressure control operation is only one example, and the present disclosure should not be limited to this boost pressure control operation.

Furthermore, the ECU 12 executes the rapid warm-up of the catalyst 7 when the actual temperature or the predicted temperature of the catalyst 7 has not yet reached the activation temperature at the time of, for example, immediately after the cold start of the engine. Specifically, at the time of executing the rapid warm-up of the catalyst 7, the ECU 12 sets the opening degree of the wastegate valve 9 to a predetermined opening degree. As a result, it is possible to limit the heat of the exhaust gas from being taken away by the wastegate valve 9. This rapid warm-up control operation of the catalyst 7 is only one example, and the present disclosure should not be limited to this rapid warm-up control operation of the catalyst 7.

(First Characteristic Technique)

A manufacturing method of the electric actuator 11 will now be described.

The housing 20 has the opening portion α that opens toward the upper side. Besides the motor insertion chamber γ, an installation space for installing the speed reducing gear device 22 and the output shaft 23 is provided in the inside of the opening portion α. All of the corresponding components, which are directly installed to the housing 20 and include the electric motor 21, the speed reducing gear device 22, the output shaft 23 and the cover 24, are installed to the housing 20 from the upper side toward the lower side.

This point will be specifically described.

At the time of assembling the electric actuator 11, the housing 20 is placed such that the opening portion α is directed toward the upper side, and then an inside assembling step, a cover assembling step and a lever assembling step are executed.

The inside assembling step is a step of assembling the electric motor 21, the speed reducing gear device 22 and the output shaft 23 into the opening portion α from the upper side. With this step, the electric motor 21, the speed reducing gear device 22 and the output shaft 23 are assembled in the inside of the housing 20 in the axial direction of the output shaft 23 through the opening portion α of the housing 20.

Details of the inside assembling step will now be described.

A wave washer 38 is installed from the upper side to a bottom of the motor insertion chamber γ. The wave washer 38 is compressed between the bottom of the motor insertion chamber γ and the electric motor 21 to limit the vibration of the electric motor 21.

Next, the electric motor 21 is inserted from the upper side into the motor insertion chamber γ.

Next, the electric motor 21 is fixed to the housing 20 by threadably engaging, for example, a plurality of screws to the housing 20.

The first intermediate shaft 31 and the second intermediate shaft 32 are press-fitted from the upper side into the housing 20. Specifically, a first press-fitting hole 39, into which the first intermediate shaft 31 is press-fitted, and a second press-fitting hole 40, into which the second intermediate shaft 32 is press-fitted, are preformed at a bottom surface of the inside of the opening portion α.

The first intermediate shaft 31 is press-fitted into the first press-fitting hole 39, and the second intermediate shaft 32 is press-fitted into the second press-fitting hole 40.

The lower bearing 33 is press-fitted from the upper side into the housing 20. Specifically, a lower bearing hole 41, into which the lower bearing 33 is press-fitted, is preformed at the housing 20. The lower bearing 33 is press-fitted into the lower bearing hole 41.

The output shaft 23 is press-fitted into an inside of the lower bearing 33. Specifically, the final gear 29 and the magnetic flux generating portion 36 are installed to the output shaft 23. Therefore, when the output shaft 23 is press-fitted into the inside of the lower bearing 33, the final gear 29 and the magnetic flux generating portion 36 are also assembled to the housing 20.

Next, the second intermediate gear 28 is assembled to the second intermediate shaft 32. Then, the first intermediate gear 27 is assembled to the first intermediate shaft 31.

Thereby, the inside assembling step is completed.

Next, the cover assembling step is executed.

The cover assembling step is a step of assembling the cover 24 to the housing 20.

Specifically, the cover 24 is installed from the upper side to the housing 20. At this time, the output shaft 23 is press-fitted into an inside of the upper bearing 34 that is press-fitted into the cover 24.

Next, the cover 24 is fixed to the housing 20 by threadably engaging a plurality of bolts 42 from the upper side to the housing 20.

A connector 43, which makes electrical connections to the electric motor 21 and the magnetic sensing device 37, is formed at the cover 24. Also, the magnetic sensing device 37 is installed to the cover 24. Therefore, when the cover 24 is assembled to the housing 20, assembling of the connector 43 and the magnetic sensing device 37 is completed.

Thereby, the cover assembling step is completed.

Next, the lever assembling step is executed.

The lever assembling step is a step of fixing the actuator lever 13 from upper side to the distal end part of the output shaft 23. Although a fixing technique for fixing the output shaft 23 and the actuator lever 13 together should not be limited any particular one, crimping or welding may be used to fix between the output shaft 23 and the actuator lever 13. The drawings show an example where the actuator lever 13 is fixed to the output shaft 23 by crimping the distal end part of the output shaft 23.

A pin 44, which is parallel to the output shaft 23, is installed to a rotating end part of the actuator lever 13. The pin 44 is a component that is rotatably connected to an end part of the rod 15 and conducts the rotational torque of the actuator lever 13 to the rod 15. The pin 44 is joined to the actuator lever 13 in advance by a connecting technique, such as crimping or welding.

Thereby, the lever assembling step is completed, and the assembling of the electric actuator 11 is computed.

(Advantages)

In the present embodiment, as discussed above, the electric actuator 11, which is used for the turbocharger T, can be assembled without inverting the orientation of the housing 20.

Therefore, the assembling of the electric actuator 11 can be eased, and the manufacturing costs of the electric actuator 11 can be limited.

Furthermore, unlike the prior art technique, it is possible to eliminate the components, which are assembled upon inverting the orientation of the housing. Therefore, the number of components can be reduced. Even with the reduction of the number of components, it is possible to limit the costs of the electric actuator 11.

(Second Characteristic Technique)

As discussed above, the motor insertion chamber γ, into which the electric motor 21 is assembled, is formed at the housing 20.

An enlarged diameter hole 45 is formed at an upper end of the motor insertion chamber γ and is shaped into a form that is produced by enlarging a diameter of an insertion opening γa of the motor insertion chamber γ. The enlarged diameter hole 45 is in a form of a circular hole that is coaxial with the axis of the motor insertion chamber γ.

In the present embodiment, positioning of the electric motor 21 relative to the housing 20 is made by fitting a motor flange 46, which is fixed to the electric motor 21, into the inside of the enlarged diameter hole 45.

(Advantages)

An axis-to-axis pitch between the rotatable shaft of the electric motor 21 and the first intermediate shaft 31, an axis-to-axis pitch between the first intermediate shaft 31 and the second intermediate shaft 32, and an axis-to-axis pitch between the second intermediate shaft 32 and the output shaft 23 are all defined by the housing 20.

Therefore, the gear meshing accuracy of the speed reducing gear device 22 can be improved. That is, the mechanical accuracy of the electric actuator 11 can be improved. Here, it should be noted that the axis-to-axis pitch refers to a distance between two shaft centers.

(Third Characteristic Technique)

The speed reducing gear device 22 includes: the first intermediate gear 27, at which the first large diameter gear 27a and the first small diameter gear 27b are coaxially formed; and the second intermediate gear 28, at which the second large diameter gear 28a and the second small diameter gear 28b are coaxially formed.

In the first intermediate gear 27, the first small diameter gear 27b is placed on the lower side of the first large diameter gear 27a. Similarly, in the second intermediate gear 28, the second small diameter gear 28b is placed on the lower side of the second large diameter gear 28a.

(Advantages)

An axial dimension H2 of all of the gears of the speed reducing gear device 22 can be placed in an axial dimension H1 of the electric motor 21. In this way, the axial dimension of the electric actuator 11 can be limited.

Furthermore, the speed reducing gear device 22 conducts the output torque of the electric motor 21 toward the lower side. Therefore, a location of a center of gravity of the speed reducing gear device 22 can be placed closer to a location of a center of gravity of the electric motor 21. In this way, an amplitude of the vibration of the electric actuator 11 can be limited, and thereby the vibration resistance of the electric actuator 11 can be improved.

(Related Technique of Third Characteristic Technique)

In this embodiment, the first intermediate gear 27, the second intermediate gear 28 and the final gear 29 are made of resin.

In this way, the weight of the speed reducing gear device 22 can be reduced, and the manufacturing costs of the speed reducing gear device 22 can be limited.

In addition, since the weight of the speed reducing gear device 22 is reduced, the weight of the electric actuator 11 can be also reduced. By reducing the weight of the electric actuator 11, the vibration resistance of the electric actuator 11 can be further improved.

(Fourth Characteristic Technique)

The housing 20 has a wall 47, which is shaped into a ring form. This wall 47 forms a peripheral edge of the opening portion α, and the cover 24 is assembled to an upper end part of the wall 47.

(Advantages)

The wall 47, which forms the peripheral edge of the opening portion α, functions as a reinforcing rib. Thus, the wall thickness of the housing 20 can be reduced while a required strength of the housing 20 is maintained.

(Fifth Characteristic Technique)

The cover 24 is made of a resin material. The resin material of the cover 24 is used to mold motor terminals 51, which supply an electric power to the electric motor 21, by insert-molding and the resin material of the cover 24 forms the connector 43 to be connected with an external device.

Specifically, relay terminals 52, which are connected to power supply terminals 21b of the electric motor 21 to make an electrical connection therewith; the magnetic sensing device 37; sensor terminals 53, which are electrically connected to the magnetic sensing device 37; a plurality of collars 54, which are made of metal and receives the bolts 42, respectively; and a bearing holder 55, which is made of metal and receives the upper bearing 34, are insert-molded at the cover 24 besides the motor terminals 51.

End parts of the motor terminals 51 and end parts of the sensor terminals 53 are exposed in the inside of the connector 43. A portion of each of the relay terminals 52 is exposed to a back surface of the cover 24. When the cover 24 is assembled to the housing 20, the relay terminals 52 are electrically connected to the power supply terminals of the electric motor 21.

(Advantages)

The various electrical components, which include the motor terminals 51, are insert-molded in the resin material of the cover 24. The assembling of the various electrical components is completed by assembling the cover 24 to the housing 20. Therefore, the assembling of the electric actuator 11 can be eased.

Furthermore, the connector 43 is made of the resin that is the material of the cover 24. Therefore, the number of constituent components of the electric actuator 11 can be limited.

(Related Technique of Fifth Characteristic Technique)

A gasket groove, into which a gasket 56 is installed, is formed at the cover 24 at the time of molding the cover 24. The gasket 56 is made of a rubber material that is shaped into a ring form and seals a contact location between the housing 20 and the cover 24.

(Sixth Characteristic Technique)

The collars 54, which are made of the metal and are shaped into a tubular form to receive the bolts 42, are insert-molded in the resin material of the cover 24.

The connector 43 is placed between corresponding two of the collars 54. Specifically, the connector 43 is located at an intermediate part between the adjacent two collars 54.

(Advantages)

The connector 43 is supported at the location between the two bolts 42 that are threadably engaged to the housing 20. Therefore, the limiting of the vibration of the connector 43 can be improved. In this way, even when vehicle vibration and engine vibration are applied to the connector 43, a damage of, for example, a base part of the connector 43 can be avoided.

(Seventh Characteristic Technique)

The speed reducing gear device 22 includes the first intermediate shaft 31 and the second intermediate shaft 32, which are parallel to the output shaft 23.

A lower part of the first intermediate shaft 31 is fixed to the housing 20 by press-fitting. Furthermore, an upper part of the first intermediate shaft 31 is fitting into an inside of a first recess 61 that is formed at the cover 24.

Similarly, a lower part of the second intermediate shaft 32 is fixed to the housing 20 by press-fitting. Furthermore, an upper part of the second intermediate shaft 32 is fitted into an inside of a second recess 62.

The first recess 61 and the second recess 62 are recesses that are formed at a lower surface of the cover 24 and are opened toward the lower side. The first recess 61 and the second recess 62 are formed simultaneously at the time of molding the cover 24.

(Advantages)

Tilting of the first intermediate shaft 31 can be limited by the first recess 61. Similarly, tilting of the second intermediate shaft 32 can be limited by the second recess 62. Specifically, even in a state where a load is applied to the speed reducing gear device 22, it is possible to maintain the axis-to-axis pitches of the rotatable shaft of the electric motor 21, the first intermediate shaft 31, the second intermediate shaft 32 and the output shaft 23. In this way, even in the state where the load is applied, the appropriate gear meshing of the speed reducing gear device 22 can be maintained.

Furthermore, since the tilting of the first intermediate shaft 31 can be limited by the first recess 61, the first intermediate shaft 31 can be designed as a shaft that is supported at two ends of the shaft. Thus, the diameter of the first intermediate shaft 31 can be reduced, and thereby the first intermediate shaft 31 can contribute to the size reduction and the weight reduction of the electric actuator 11.

Similarly, since the tilting of the second intermediate shaft 32 can be limited by the second recess 62, the second intermediate shaft 32 can be designed as a shaft that is supported at two ends of the shaft. Thus, the diameter of the second intermediate shaft 32 can be reduced, and thereby the second intermediate shaft 32 can contribute to the size reduction and the weight reduction of the electric actuator 11.

(Eighth Characteristic Technique)

The output shaft 23 is rotatably supported by the lower bearing 33, which is installed to the housing 20, and the upper bearing 34, which is installed to the cover 24.

Figure 9:
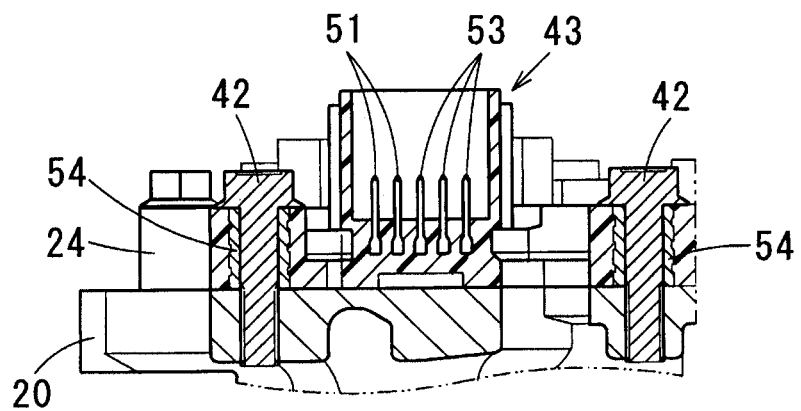
FIG. 9 is a cross-sectional view taken along line IX-IX in FIG. 3.
Figure 10:
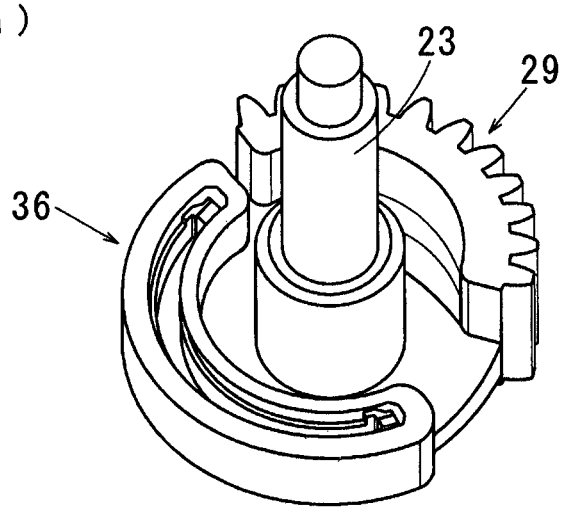
FIG. 10(a) is a perspective view of an output shaft, to which a resin component of a final gear is fixed.
FIG. 10(b) is a perspective view of a magnetic flux generating portion that is molded in the resin component.
FIG. 10(c) is a view of the output shaft taken in an axial direction of the output shaft.
Figure 10:
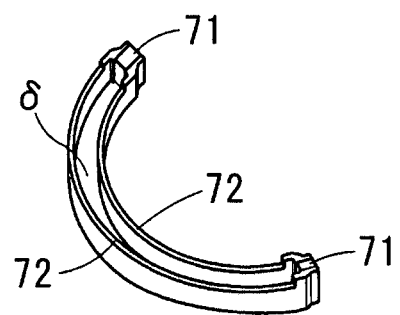
Figure 10:
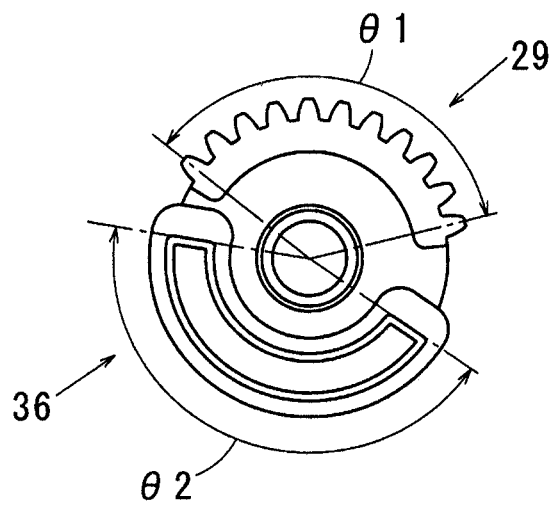
Figure 11:
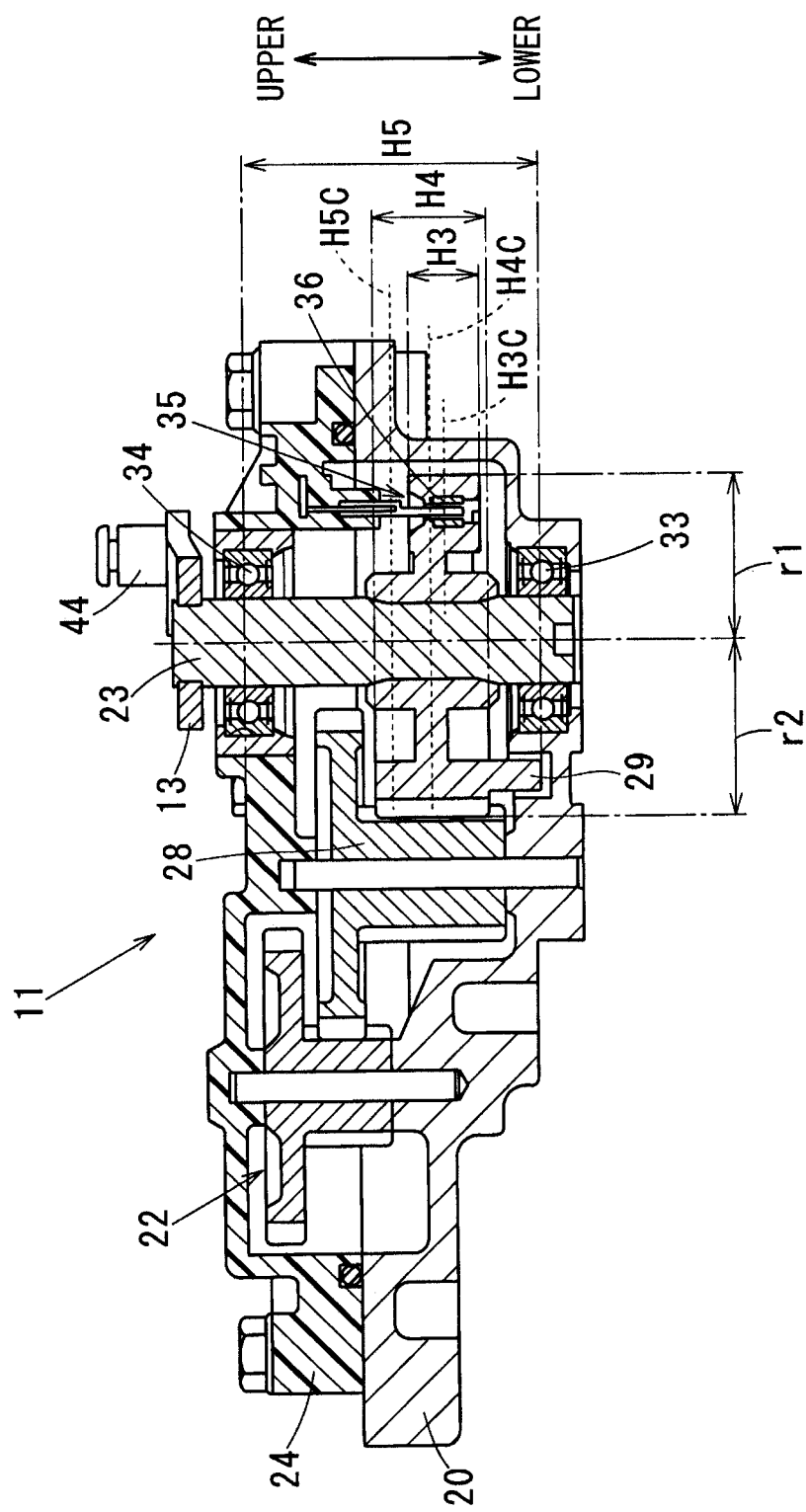
FIG. 11 is a descriptive view for dimensions of the electric actuator according to the embodiment of the present disclosure.

As shown in FIG. 9, a ball bearing 63 is used as each of the lower bearing 33 and the upper bearing 34. The ball bearing 63 includes an inner race 63a and an outer race 63b, between which a seal material 63c made of a rubber material is interposed to seal between the inner race 63a and the outer race 63b.

An outer peripheral surface of the lower bearing 33 is press-fitted to the housing 20. Furthermore, the output shaft 23 is press-fitted to an inner peripheral part of the lower bearing 33.

An outer peripheral surface of the upper bearing 34 is press-fitted to the cover 24. Specifically, the outer peripheral surface of the upper bearing 34 is press-fitted into the bearing holder 55 that is insert-molded in the cover 24. Furthermore, the output shaft 23 is press-fitted to the inner peripheral part of the upper bearing 34.

(Advantages)

With the above construction, the water resistance of the electric actuator 11 can be ensured. Specifically, even when water is applied to the upper bearing 34 or the lower bearing 33, it is possible to avoid intrusion of the water into the inside of the actuator through the upper bearing 34 or the lower bearing 33.

(Ninth Characteristic Technique)

The lower bearing hole 41 of the housing 20, into which the lower bearing 33 is press-fitted, has a lower flange 41a that limits movement of the lower bearing 33 toward the lower side.

The lower flange 41a is a stepped part that is formed by reducing a diameter of a lower end part of the lower bearing hole 41, and the lower flange 41a is formed integrally with the housing 20 in one piece.

Similarly, the upper bearing hole 64 of the cover 24, into which the upper bearing 34 is press-fitted, has an upper flange 64a that limits movement of the upper bearing 34 toward the upper side.

In the present embodiment, a press-fitting subject, into which the upper bearing 34 is press-fitted, is the bearing holder 55 that is insert-molded in the cover 24. Therefore, in the present embodiment, the upper bearing hole 64 is formed at the bearing holder 55. The upper flange 64a is a stepped part that is formed by reducing a diameter of an upper end part of the upper bearing hole 64, into which the upper bearing 34 is press-fitted, and the upper flange 64a is formed integrally with the bearing holder 55 in one piece.

(Advantages)

Positioning of the lower bearing 33 is eased by the provision of the lower flange 41a at the housing 20.

Similarly, positioning of the upper bearing 34 is eased by the provision of the upper flange 64a at the bearing holder 55.

In this way, the assembling of the lower bearing 33 and the upper bearing 34 can be eased.

(Tenth Characteristic Technique)

A plurality of lower crimped portions 41b, which limit upward movement of the lower bearing 33 press-fitted to the housing 20, is formed at an inner peripheral surface of the lower bearing hole 41.

Similarly, a plurality of upper crimped portions 64b, which limit downward movement of the upper bearing 34 press-fitted to the bearing holder 55, is formed at an inner peripheral surface of the upper bearing hole 64.

The lower crimped portions 41b and the upper crimped portions 64b are made by a technique of forming projections by locally plastically deforming corresponding portions of the metal of the housing 20 or the bearing holder 55.

The lower bearing 33, which is assembled to the housing 20, is fixed by the lower flange 41a and the lower crimped portions 41b.

Similarly, the upper bearing 34, which is assembled to the cover 24, is fixed by the upper flange 64a and the upper crimped portions 64b.

Therefore, even when a load is applied to the output shaft 23 in the axial direction, axial deviation of the lower bearing 33 and the upper bearing 34 can be limited to limit axial positional deviation of the output shaft 23.

(Eleventh Characteristic Technique)

The upper bearing hole 64, which is for the upper bearing 34 and is formed by the cover 24, is covered with the actuator lever 13. That is, the inside of the upper flange 64a is guarded by the actuator lever 13.

Specifically, a through-hole 13a, into which the output shaft 23 is inserted, is formed at the actuator lever 13. The actuator lever 13 has an outer peripheral edge that is shaped into a form of an arc, which is coaxial with the through-hole 13a. A diameter of this arc is set to be larger than an inner diameter of the upper flange 64a.

With the above-described construction, the upper flange 64a and the upper bearing 34 are covered with the actuator lever 13. In other words, when the electric actuator 11 is viewed from the upper side, an inner peripheral edge of the upper flange 64a is covered with the actuator lever 13.

(Advantages)

It is conceivable that the high pressure water strikes the upper surface of the electric actuator 11 by high pressure washing or the like. In this case, since the actuator lever 13 guards an intrusion route of the water, it is possible to avoid inconvenience of the intrusion of the water into the inside of the electric actuator 11 even if the high pressure water strikes the electric actuator 11.

(Twelfth Characteristic Technique)

The pin 44, which is parallel to the output shaft 23, is installed to the rotating end part of the actuator lever 13. This pin 44 extends toward the upper side of the actuator lever 13. The pin 44 and the rod 15 are coupled with each other on the upper side of the actuator lever 13.

Here, a part of the upper surface of the actuator lever 13, at which the pin 44 is placed, will be referred to as a pin end surface A. In this embodiment, the pin end surface A is placed on the upper side of the upper end B of the output shaft 23.

Specifically, a step part C is formed at a radial intermediate part of the actuator lever 13 to place the pin end surface A on the upper side of a base of the actuator lever 13, which is coupled to the output shaft 23.

(Advantages)

With this construction, the rod 15 does not interfere with the output shaft 23. That is, no matter which direction the rod 15 is disposed with respect to the pin 44, there will be no disadvantageous abutment of the rod 15 to the output shaft 23.

Therefore, the installability of the electric actuator 11 relative to the turbocharger T can be improved.

(Thirteenth Characteristic Technique)

The electric actuator 11 includes the rotational angle sensor 35 that senses the rotational angle of the output shaft 23.

The rotational angle sensor 35 includes: the magnetic flux generating portion 36, which is rotated integrally with the output shaft 23; and the magnetic sensing device 37, which is installed to one of the cover 24 and the housing 20 and senses the magnetic flux generated from the magnetic flux generating portion 36. In this embodiment, there is described the example where the magnetic sensing device 37 is installed to the cover 24.

(Fourteenth Characteristic Technique)

A gear range θ1, in which the final gear 29 of the speed reducing gear device 22 is placed, and a sensing range θ2, in which the magnetic flux generating portion 36 is placed, exist separately from each other around the output shaft 23.

The gear range θ1 and the sensing range θ2 are placed at different ranges, respectively, in the radial direction around the output shaft 23. That is, the gear range θ1 and the sensing range θ2 are placed such that the gear range θ1 and the sensing range θ2 do not overlap with each other in the radial direction.

(Advantages)

In recent years, as the exhaust gas regulations are tightened, it is required to monitor an opening degree of respective valves used for the turbocharger T. Specifically, it has been demanded to monitor the opening degree of the wastegate valve 9 of the present embodiment and operational states of a variable capacity type nozzle vane and of a change valve, which are different from the present embodiment. Therefore, it has been demanded to install the rotational angle sensor 35 to the electric actuator 11.

However, the rotational angle sensor 35 is not installed to the electric actuator disclosed in the patent literature 1. Therefore, when the rotational angle sensor 35 is installed to the electric actuator disclosed in the patent literature 1, it will result in an increase in the size of the electric actuator 11.

In contrast, in the electric actuator 11 of the present embodiment, the rotational angle sensor 35 is placed at a location that is displaced from the axis of the output shaft 23. In this way, it is not required to place the rotational angle sensor 35 at a shaft end of the output shaft 23. Therefore, even though the rotational angle sensor 35 is installed to the electric actuator 11, it will not result in an increase in the size of the electric actuator 11 in the axial direction.

Specifically, in the present embodiment, a rotational space, in which the final gear 29 is not formed, is used to place the magnetic flux generating portion 36. In this way, the rotational angle sensor 35 can be installed to the electric actuator 11 without resulting in an increase in the size of the electric actuator 11.

(Fifteenth Characteristic Technique)

A size of the sensing range θ2, which is measured in the radial direction, is set to be larger than a size of the gear range θ1, which is measured in the radial direction.

The sensing range θ2 is a range where a signal, which is outputted from the magnetic sensing device 37 in response to the magnetic flux generated from the magnetic flux generating portion 36, monotonously increases or decreases in response to a change in the angle of the output shaft 23.

(Advantages)

The gear range θ1 is set according to a required operational angle of the wastegate valve 9. Therefore, the operational range of the wastegate valve 9 is limited to the gear range θ1.

Thus, the entire range of the operational angle of the wastegate valve 9 can be reliably sensed with the rotational angle sensor 35 by setting that the sensing range θ2 is larger than the gear range θ1.

(Sixteenth Characteristic Technique)

An extending direction of the axis of the output shaft 23 will be referred to as an axial direction.

A thickness of the magnetic flux generating portion 36, which is measured in the axial direction, will be referred to as a magnetic flux portion thickness H3.

A thickness of the final gear 29, which is measured in the axial direction, will be referred to as a final stage thickness H4.

In the present embodiment, the magnetic flux portion thickness H3 is set within the range of the final stage thickness H4.

(Advantages)

Thereby, the magnetic flux generating portion 36 does not cause a disadvantageous increase in the axial dimension of the electric actuator 11. Specifically, the rotational angle sensor 35 can be installed to the electric actuator 11 without causing an increase in the size of the electric actuator 11.

(Seventeenth Characteristic Technique)

A center H3C of the magnetic flux portion thickness H3, which is centered in the axial direction, is placed on a lower side of a center H4C of the final stage thickness H4, which is centered in the axial direction.

(Advantages)

In this way, the magnetic flux generating portion 36 can be brought closer to a bottom surface of the opening portion α of the housing 20. That is, the magnetic flux generating portion 36 can be brought closer to a lower side support part of output shaft 23.

Therefore, even when the output shaft 23 vibrates in such a manner that an origin of the vibration is located at a center of the lower bearing 33, it is possible to limit the vibration of the magnetic flux generating portion 36. Thus, the angle sensing accuracy of the rotational angle sensor 35 can be improved, and thereby the reliability can be improved.

(Eighteenth Characteristic Technique)

The center H4C of the final stage thickness H4 is placed on the lower side of a center H5C of a distance H5, which is measured between the lower bearing 33 and the upper bearing 34 in the axial direction.

(Advantages)

With the above-described configuration, the final gear (output gear) 29 can be brought closer to the bottom surface of the opening portion α of the housing 20. That is, the final gear 29 can be brought closer to the lower bearing 33.

Thereby, flexing of the output shaft 23, which is caused by the torque applied to the final gear 29, can be limited. By liming the flexing of the output shaft 23, the vibration of the magnetic flux generating portion 36 caused by the flexing of the output shaft 23 can be limited. Thus, the angle sensing accuracy of the rotational angle sensor 35 can be improved, and thereby the reliability can be improved.

(Nineteenth Characteristic Technique)

A sensor radius r1, which is a dimension of the magnetic flux generating portion 36 measured in the radial direction, is set to be equal to or smaller than a gear radius r2, which is a dimension of the final gear 29 measured in the radial direction. That is, there is satisfied a relationship of r1≤r2.

(Advantages)

As indicated in the present embodiment, in the case where the magnetic flux generating portion 36 is placed around the output shaft 23, the positional sensing accuracy of the magnetic sensing device 37 can be improved by increasing the sensor radius r1. However, when the sensor radius r1 is increased beyond the gear radius r2, the size of the electric actuator 11 is disadvantageously increased.

In contrast, when the sensor radius r1 is set to be equal to or smaller than the gear radius r2, it is possible to avoid the increase in the size of the electric actuator 11. Specifically, the rotational angle sensor 35 can be installed to the electric actuator 11 without causing an increase in the size of the electric actuator 11.

Particularly, when the sensor radius r1 is set to be equal to the gear radius r2, the sensing accuracy of the magnetic sensing device 37 is maximized while minimizing the size of the electric actuator 11.

(Twentieth Characteristic Technique)

The magnetic flux generating portion 36 is insert-molded in the resin component that forms the final gear. The magnetic flux generating portion 36 includes two permanent magnets 71, and two yokes 72 made of magnetic metal, and these permanent magnets 71 and the yokes 72 are combined to form a closed magnetic circuit. The two yokes 72 are shaped into arcuate forms, respectively, which have different radii of curvature, and these two yokes 72 are combined.

The type of permanent magnet 71 is not necessarily limited to any particular one and may be, for example, a rare-earth magnet or a ferrite magnet.

The two yokes 72 are shaped into the arc forms, respectively, which have the different radii of curvature, and each of the two yokes 72 is formed by press forming of, for example, iron thin plate. One end parts of the two yokes 72 clamp one of the permanent magnets 71, and the other end parts of the two yokes 72 clamp another one of the permanent magnets 71.

An arcuate gap δ, into which the magnetic sensing device 37 is inserted, is formed between the two yokes 72. The arcuate gap δ forms an arc that is coaxial with the central axis of the output shaft 23. A gap width between the two yokes 72 is set to be constant in the radial direction. The arcuate gap δ is set such that even when the magnetic flux generating portion 36 is rotated in response to the rotation of the output shaft 23, the magnetic flux generating portion 36 maintains a non-contact state relative to the magnetic sensing device 37.

The two permanent magnets 71 are arranged such that polarities of the two permanent magnets 71 are opposite to each other. Specifically, among the two permanent magnets 71, one permanent magnet 71 has the S-pole that faces the output shaft 23. Furthermore, among the two permanent magnets 71, the other permanent magnet 71 has the N-pole that faces the output shaft 23. With the above-described construction, there is formed the closed magnetic circuit, in which the magnetic flux flows through the one permanent magnet 71, the outer side yoke 72, the other permanent magnet 71, and the inner side yoke 72 in this order.

A portion of the magnetic flux, which is generated at the magnetic flux generating portion 36, passes through the magnetic sensing device 37 inserted into the arcuate gap δ. Specifically, a portion of the magnetic flux of one of the yokes 72 flows into the other one of the yokes 72 through the magnetic sensing device 37. The magnetic sensing device 37 includes a Hall IC that generates a signal, which corresponds to the magnetic flux passing through the Hall IC. Therefore, when the magnetic flux generating portion 36 is rotated in response to the rotation of the output shaft 23, the amount of magnetic flux, which passes through the Hall IC, changes, and thereby the output signal of the magnetic sensing device 37 changes. The ECU 12 reads an angle of the output shaft 23, i.e., a drive angle of the actuator lever 13 from the signal inputted from the magnetic sensing device 37.

(Advantages)

When the magnetic flux generating portion 36, which forms the closed magnetic circuit, is used, it is possible to make it less susceptible to external magnetic influences, such as magnetic noises, which are applied from the outside. Thereby, the sensing accuracy of the rotational angle sensor 35 for sensing the rotational angle of the output shaft 23 can be improved.

(Twenty-First Characteristic Technique)

The electric actuator 11 of the present embodiment is manufactured with the above-described manufacturing method. That is, the electric actuator 11, which is manufactured with the above-described manufacturing method, enables assembling (unidirectional assembling) of the components in a single direction relative to the housing 20, and thereby the manufacturing costs can be minimized.

Furthermore, since the electric actuator 11 has the first to twentieth characteristic techniques, it is possible to provide the inexpensive, compact, high-performance electric actuator 11.

Other Embodiment

In the above embodiment, the electric actuator 11 for driving the wastegate valve 9 is exemplified. However, the drive subject of the electric actuator 11 is not necessarily limited to the wastegate valve 9.

One specific example is as follows. That is, the electric actuator 11 may drive a change valve that opens and closes a second exhaust gas scroll provided at the turbine housing 6b. It should be understood that the electric actuator 11 may be used to drive both of the wastegate valve 9 and the change valve.

Alternatively, the present disclosure may be applied to an electric actuator 11 that is used to operate a nozzle vane (one example of a valve) of the turbocharger T that uses variable nozzle mechanism.

Further alternatively, the present disclosure may be applied to an electric actuator 11 that switches between two turbochargers T at a two-stage turbocharger that uses the two turbochargers T.

In the above embodiment, there is discussed the example, in which the first intermediate gear 27 and the second intermediate gear 28 are placed between the pinion gear 26 and the final gear 29. However, the present disclosure is not necessarily limited to this example. That is, a single intermediate gear or three or more intermediate gears may be placed between the pinion gear 26 and the final gear 29.

The invention claimed is:

1. A manufacturing method of an electric actuator that includes:
   a housing that has an opening portion, which opens in one direction;
   an electric motor that is installed in the housing;
   a speed reducing gear device of a parallel shaft type that is installed in the housing and reduces a rotational speed of a rotational force generated by the electric motor;
   an output shaft that is installed in the housing and is driven by the rotational force, the rotational speed of which is reduced by the speed reducing gear device;
   a cover that is installed to the housing, wherein the cover forms a space between the cover and the housing to receive the electric motor and the speed reducing gear device in the space, and a distal end part of the output shaft is exposed from the cover to an outside of the cover; and
   an actuator lever that is fixed to the distal end part of the output shaft, which is exposed to the outside of the cover, wherein the actuator lever drives a valve installed at a turbocharger, the manufacturing method of the electric actuator comprising:
   an inside assembling step of assembling the electric motor, the speed reducing gear device and the output shaft into an inside of the opening portion from an upper side, while a side in an opening direction of the opening is defined as the upper side;
   a cover assembling step of assembling the cover to the housing from the upper side after the inside assembling step; and
   a lever assembling step of fixing the actuator lever to the distal end part of the output shaft from the upper side after the cover assembling step.

2. The manufacturing method of the electric actuator according to claim 1, wherein:
   the housing has a motor insertion chamber, into which the electric motor is inserted;
   an insertion opening of the motor insertion chamber, through which the electric motor inserted into the motor insertion chamber, is provided with an enlarged diameter hole, which is shaped by enlarging a diameter of the insertion opening; and
   the electric motor is positioned by fitting a motor flange, which is fixed to the electric motor, into an inside of the enlarged diameter hole.

3. The manufacturing method of the electric actuator according to claim 1, wherein:
   the speed reducing gear device includes an intermediate gear, to which a large diameter gear having a large diameter and a small diameter gear having a small diameter are coaxially provided; and
   the intermediate gear is arranged such that the small diameter gear is placed on a lower side of the large diameter gear.

4. The manufacturing method of the electric actuator according to claim 1, wherein a wall, which is shaped into a ring form, is formed integrally with the housing, and the cover is installed to an upper end of the wall.

5. The manufacturing method of the electric actuator according to claim 1, wherein:
   the cover is made of a resin material; and
   a motor terminal for supplying an electric power to the electric motor is molded into the resin material of the cover while the resin material of the cover forms a connector for connecting with an external device.

6. The manufacturing method of the electric actuator according to claim 5, wherein:
a plurality of collars, each of which is made of metal and receives a corresponding bolt for fixing the cover to the housing, is molded into the resin material of the cover; and
the connector formed between two of the plurality of collars.

7. The manufacturing method of the electric actuator according to claim 1, wherein:
the speed reducing gear device includes an intermediate shaft that is parallel with the output shaft;
a lower part of the intermediate shaft is press-fitted to and is thereby fixed to the housing; and
an upper part of the intermediate shaft is fitted into an inside of a recess, which is formed in the cover.

8. The manufacturing method of the electric actuator according to claim 1, wherein:
the output shaft is rotatably supported by a lower bearing, which is installed to the housing, and an upper bearing, which is installed to the cover; and
a ball bearing, in which a space between an inner race and an outer race is sealed with a seal material made of a rubber material, is used as each of the lower bearing and the upper bearing.

9. The manufacturing method of the electric actuator according to claim 8, wherein:
a lower bearing hole of the housing, into which the lower bearing is press-fitted, is provided with a lower flange that limits movement of the lower bearing toward a lower side; and
an upper bearing hole of the cover, into which the upper bearing is press-fitted, is provided with an upper flange that limits movement of the upper bearing toward an upper side.

10. The manufacturing method of the electric actuator according to claim 9, wherein:
a plurality of lower crimped portions, which limit movement of the lower bearing toward the upper side, is formed at an inner peripheral surface of the lower bearing hole; and
a plurality of upper crimped portions, which limit movement of the upper bearing toward the lower side, is formed at an inner peripheral surface of the upper bearing hole.

11. The manufacturing method of the electric actuator according to claim 9, wherein the upper flange is covered with the actuator lever.

12. The manufacturing method of the electric actuator according to claim 1, wherein the actuator lever includes a pin that is parallel with the output shaft, while a portion of an upper surface of the actuator lever, at which the pin is provided, is defined as a pin end surface, and the pin end surface is placed on an upper side of an upper end of the output shaft.

13. The manufacturing method of the electric actuator according to claim 1, wherein:
the electric actuator includes a rotational angle sensor that senses a rotational angle of the output shaft;
the rotational angle sensor includes:
a magnetic flux generating portion that is rotated integrally with the output shaft; and
a magnetic sensing device that is installed to one of the cover or the housing and senses a magnetic flux generated by the magnetic flux generating portion; and
a gear range, in which a final gear of the speed reducing gear device is placed, and a sensing range, in which the magnetic flux generating portion is placed, are provided separately relative to each other in an area around the output shaft.

14. The manufacturing method of the electric actuator according to claim 13, wherein the gear range and the sensing range are located at differed ranges, respectively, in a radial direction around the output shaft.

15. The manufacturing method of the electric actuator according to claim 13, wherein the sensing range is larger than the gear range.

16. The manufacturing method of the electric actuator according to claim 13, wherein:
a direction of an axis of the output shaft is defined as an axial direction;
a magnetic flux portion thickness, which is a thickness of the magnetic flux generating portion measured in the axial direction, is placed within a range of a final stage thickness, which is a thickness of the final gear measured in the axial direction.

17. The manufacturing method of the electric actuator according to claim 16, wherein a center of the magnetic flux portion thickness, which is centered in the axial direction, is placed on a lower side of a center of the final stage thickness, which is centered in the axial direction.

18. The manufacturing method of the electric actuator according to claim 16, wherein a center of the final stage thickness, which is centered in the axial direction, is placed on a lower side of a center of a distance between the upper bearing and the lower bearing, which is centered in the axial direction.

19. The manufacturing method of the electric actuator according to claim 13, wherein a sensor radius, which is a radial dimension of the magnetic flux generating portion, is equal to or smaller than a gear radius, which is a radial dimension of the final gear.

20. The manufacturing method of the electric actuator according to claim 13, wherein the magnetic flux generating portion includes two permanent magnets and two yokes made of magnetic metal while the two permanent magnets and two yokes are assembled together to form a closed magnetic path.

21. The manufacturing method of the electric actuator according to claim 13, wherein:
the cover is made of a resin material; and
the magnetic sensing device and a sensor terminal electrically connected to the magnetic sensing device are molded into the resin material of the cover.

22. An electric actuator manufactured by the manufacturing method of the electric actuator according to claim 1.

23. An electric actuator comprising:
a housing that has an opening portion), which opens in one direction;
an electric motor that is installed in the housing;
a speed reducing gear device of a parallel shaft type, which is installed in the housing and reduces a rotational speed of a rotational force generated by the electric motor;
an output shaft that is installed in the housing and is driven by the rotational force, the rotational speed of which is reduced by the speed reducing gear device;

a cover that is installed to the housing, wherein the cover forms a space between the cover and the housing to receive the electric motor and the speed reducing gear device in the space, and a distal end part of the output shaft is exposed from the cover to an outside of the cover; and an actuator lever that is fixed to the distal end part of the output shaft, which is exposed to the outside of the cover, wherein the actuator lever drives a valve installed at a turbocharger, wherein:

the electric motor, the speed reducing gear device and the output shaft are installed in the housing in an axial direction of the output shaft through the opening portion of the housing; and the cover closes the opening portion of the housing, in which the electric motor, the speed reducing gear device and the output shaft are installed.

24. The electric actuator according to claim 23, wherein:

the housing is a one-piece body that is seamlessly and integrally formed;

the electric motor is inserted into a motor insertion chamber formed in a motor insertion portion of the housing; and an outer surface of the motor insertion portion is directly exposed to surrounding atmosphere.

* * * * *